United States Patent [19]

Boitnott et al.

[11] Patent Number: 5,667,592

[45] Date of Patent: Sep. 16, 1997

[54] PROCESS CHAMBER SLEEVE WITH RING SEALS FOR ISOLATING INDIVIDUAL PROCESS MODULES IN A COMMON CLUSTER

[75] Inventors: Charles A. Boitnott, Half Moon Bay; James W. Caughran, Lodi; Steve Egbert, Palo Alto, all of Calif.

[73] Assignee: Gasonics International, San Jose, Calif.

[21] Appl. No.: 633,365

[22] Filed: Apr. 16, 1996

[51] Int. Cl.[6] ............................................. C23C 16/00
[52] U.S. Cl. ................... 118/719; 156/345; 204/298.25; 204/298.35
[58] Field of Search ................ 118/719; 204/298.25, 204/298.35; 156/345

[56] References Cited

U.S. PATENT DOCUMENTS

| | | | |
|---|---|---|---|
| 4,715,921 | 12/1987 | Maher et al. | 156/345 |
| 4,733,631 | 3/1988 | Boyarsky | 118/719 |
| 4,830,700 | 5/1989 | Davis et al. | 156/345 |
| 4,832,778 | 5/1989 | Davis et al. | 156/345 |
| 4,906,328 | 3/1990 | Freeman et al. | 156/643 |
| 4,915,777 | 4/1990 | Jucha et al. | 156/643 |
| 5,019,233 | 5/1991 | Blake | 204/792.12 |
| 5,076,205 | 12/1991 | Vowles | 118/719 |
| 5,169,478 | 12/1992 | Miyamoto et al. | 156/345 |
| 5,205,919 | 4/1993 | Zejda | 204/298.25 |
| 5,281,295 | 1/1994 | Maeda et al. | 156/345 |
| 5,281,320 | 1/1994 | Turner et al. | 204/298.15 |
| 5,288,379 | 2/1994 | Namiki | 204/192.12 |
| 5,292,393 | 3/1994 | Maydan et al. | 156/345 |
| 5,302,209 | 4/1994 | Maeda et al. | 118/719 |
| 5,308,431 | 5/1994 | Maher et al. | 156/345 |
| 5,330,633 | 7/1994 | Matsumoto | 204/298.25 |
| 5,364,219 | 11/1994 | Takahashi | 414/217 |
| 5,376,223 | 12/1994 | Salimian et al. | 156/643 |

FOREIGN PATENT DOCUMENTS

| | | | |
|---|---|---|---|
| 5752138 | 3/1982 | Japan . | |
| 0287625 | 12/1987 | Japan | 156/345 |
| 2114528 | 4/1990 | Japan . | |
| 342816 | 2/1991 | Japan . | |
| 4124827 | 4/1992 | Japan | 156/345 |

*Primary Examiner*—R. Bruce Breneman
*Assistant Examiner*—Jeffrie R. Lund
*Attorney, Agent, or Firm*—Thomas E. Schatzel; Law Offices of Thomas E. Schatzel A Prof. Corporation

[57] ABSTRACT

A modular semiconductor wafer processing system comprises a plurality of detachable process reactors and other types of generators that can be attached to any of several ports on the lid of a circular wafer handling chamber. A multiple-spoke single-axis rigid-arm transfer carousel centrally located within the circular wafer handling chamber has access to the respective process areas beneath each port in the lid. A set of independent cylindrical sleeves with sealing rings are provided to rise up from the floor of the circular wafer handling chamber to contact and seal against the lid to isolate each of the process stations. The multiple-spoke single-axis rigid-arm transfer carousel is automatically positioned out of the way before the cylindrical rings are raised and sealed.

8 Claims, 6 Drawing Sheets

5,667,592

PROCESS CHAMBER SLEEVE WITH RING SEALS FOR ISOLATING INDIVIDUAL PROCESS MODULES IN A COMMON CLUSTER

BACKGROUND OF THE INVENTION

1. Field of the Invention

The invention relates generally to semiconductor processing equipment for the multiple processing of semiconductor wafers in a single cluster and more particularly to isolation barriers to separate individual process modules.

2. Description of the Prior Art

The fabrication of semiconductors and the handling of silicon wafers requires extreme cleanliness. Cleanrooms provide such clean environments, but are costly to construct and maintain. Therefore, each square foot in a cleanroom is very valuable and the semiconductor processing equipment placed in a cleanroom must make the most of the space it occupies by processing the wafers more effectively.

Cluster tools have evolved over the years that surround a wafer transfer arm, an endifector, with wafer cassette modules and process modules. The central cluster tool controller moves the wafers in and out of the various cassette and process modules. Such an arrangement can make for a very large assembly that consumes a lot of cleanroom space. The wafer transfer arm becomes a limiting factor in how fast wafers can be moved through the cluster tool. Since the single arm visits all the modules, contamination in one module can be distributed to all the modules.

SUMMARY OF THE PRESENT INVENTION

It is therefore an object of the present invention to provide a modular multiple process chamber system that has the ability to perform different processes, simultaneously on different wafers and/or sequentially on the same wafer, while the system is closed to atmosphere.

It is a further object of the present invention to provide a modular multiple chamber semiconductor processing system that allows process generators and reactors to be exchanged and rearranged quickly and easily.

It is another object of the present invention to provide a sleeve barrier to isolate individual semiconductor processing modules.

Briefly, a modular semiconductor wafer processing system embodiment of the present invention comprises a plurality of detachable process reactors and other types of generators that can be attached to any of several ports on the lid of a circular wafer handling chamber. A multiple-spoke single-axis rigid-arm transfer carousel centrally located within the circular wafer handling chamber has access to the respective process areas beneath each port in the lid. A set of independent cylindrical sleeves with sealing rings are provided to rise up from the floor of the circular wafer handling chamber to contact and seal against the lid to isolate each of the process stations. The multiple-spoke single-axis rigid-arm transfer carousel is automatically positioned out of the way before the cylindrical rings are raised and sealed.

An advantage of the present invention is that a wafer processing system is provided that supports high manufacturing throughputs.

A further advantage of the present invention is that a wafer processing system is provided that is flexible and provides high quality wafer processing.

Another advantage of the present invention is that a modular wafer process system is provided that allows mechanical interchangeability between each of several processing ports in the lid of a circular vacuum chamber.

These and other objects and advantages of the present invention will no doubt become obvious to those of ordinary skill in the art after having read the following detailed description of the preferred embodiment which is illustrated in the drawing figures.

IN THE DRAWINGS

DETAILED DESCRIPTION OF THE PREFERRED EMBODIMENTS

Figure 1A:
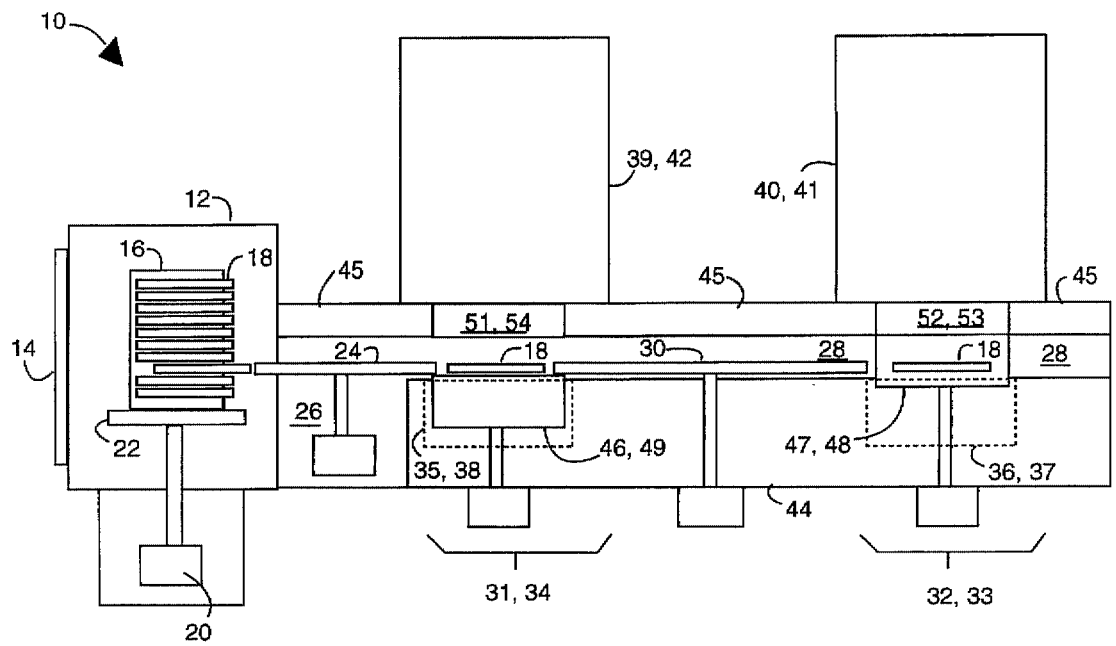
FIG. 1A is a mechanical schematic diagram in side view of a four-cluster modular wafer processing system of the present invention with a single cassette and elevator chamber for unprocessed and processed wafers.
Figure 1B:
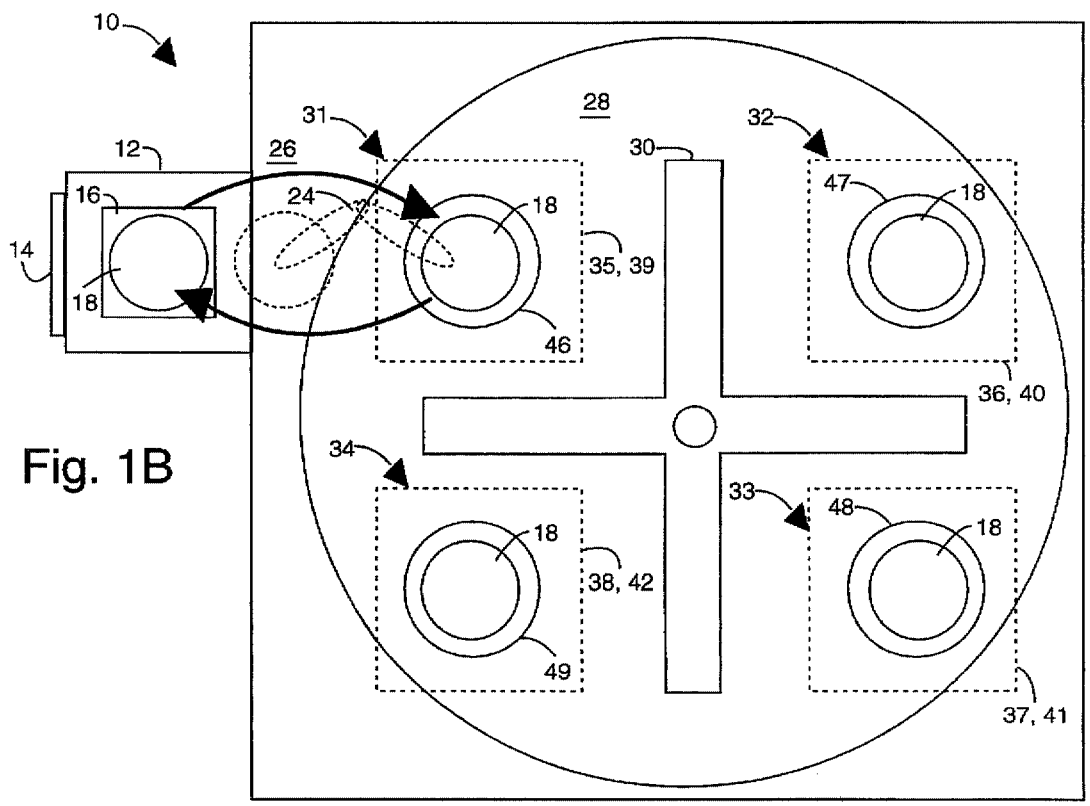
FIG. 1B is a mechanical schematic diagram in plan view of the four-cluster modular wafer processing system of FIG. 1A with the wafer carousel in a first electrode loading position.
Figure 1C:
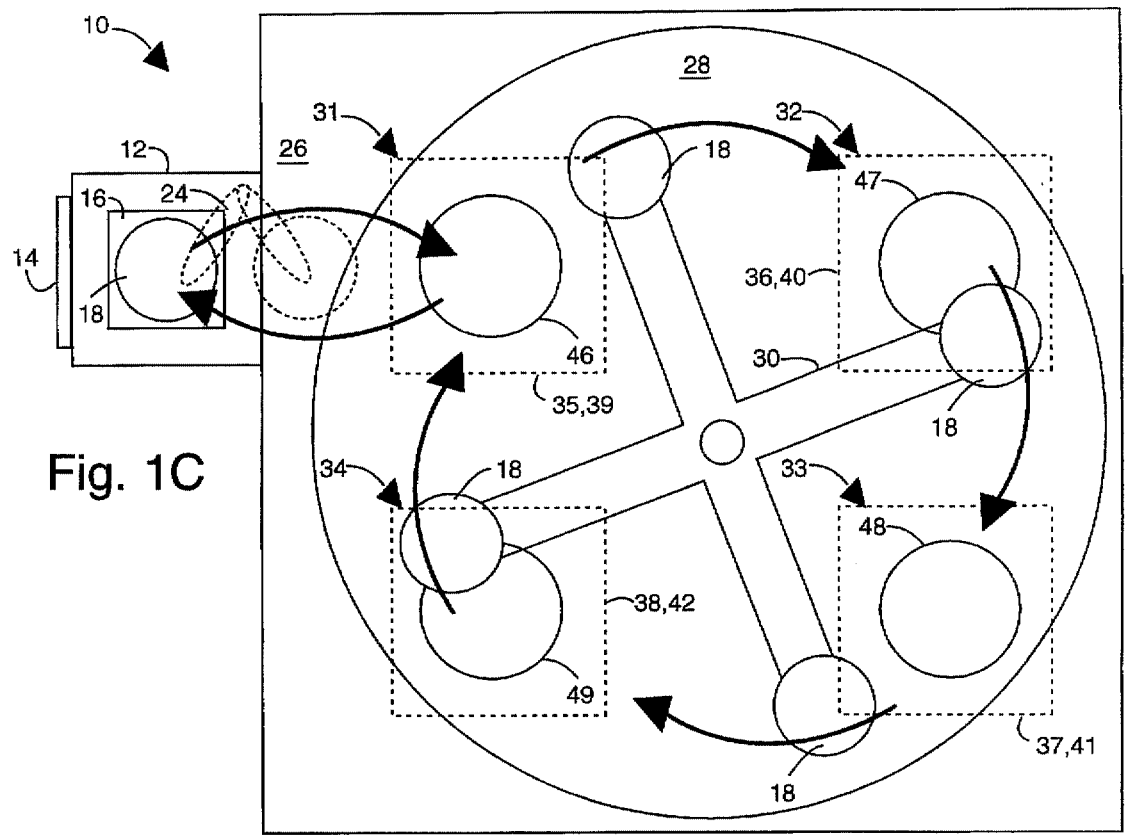
FIG. 1C is a mechanical schematic diagram in plan view of the four-cluster modular wafer processing system of FIG. 1A with the wafer carousel in a second position that allows the cylindrical sleeves at each processing station to be raised to their respective sealed positions.

FIGS. 1A, 1B, and 1C illustrate a four-cluster modular wafer processing system embodiment of the present invention, referred to herein by the general reference numeral 10. The system 10 comprises a wafer elevator chamber 12 with a vacuum seal door 14 for receiving a cassette 16 of semiconductor wafers 18. An elevator drive 20 raises and lowers an elevator platform 22 to select a particular wafer 18 for transfer by a double-axis arm 24 in an anteroom chamber 26. A circular wafer handling chamber 28 includes a multiple-spoke single-axis rigid-arm transfer carousel 30 that oscillates to transfer wafers 18 between a set of four processing station positions 31–34 that each comprise a modular bottom 35–38 and top module 39–42.

A handling chamber bottom 44 and a matching lid 45 provide a vacuum seal for the volume of the circular wafer handling chamber 28. The modular bottoms 35–38 quick-clamp into standardized reliefs in the handling chamber bottom 44 when the lid 45 is removed. The top modules 39–42 quick-clamp to matching standardized reliefs in the handling chamber lid 45. A set of four cylindrical metal sleeves 46–49, each with top and bottom O-ring seals, include actuators that raise and lower the sleeves 46–49 independently, or in unison, to individually seal together the module bottoms 35–38 to their respective module tops 39–42.

FIG. 1A shows the cylindrical metal sleeves 46 and 49 in their lowered position and the cylindrical metal sleeves 47 and 48 in their raised and sealed position with a wafer 18 inside the resulting chamber ready for processing. The cylindrical metal sleeves 46–49 are lowered to allow the transfer of wafers 18 between adjacent processing stations 31–34 by the wafer transfer carousel 30. The cylindrical metal sleeves 46–49 are raised and sealed to allow the wafers 18 to be exposed through a corresponding port 51–54 to a particular removable process module tops 39–42.

Each of the four processing station positions 31–34 can be independently populated with wafer heating and cooldown, etching, ashing & cleaning, chemical vapor deposition (CVD), physical vapor deposition (PVD), and other types of hot and cold semiconductor process modules in paired top and bottom parts.

Any of the four processing station positions 31–34 may receive conventional semiconductor process reactors for photoresist removal, cleaning, plasma etching, sputtering, vapor deposition, and/or the deposition on uniform silicon nitride films on large sized wafers. For example, a wafer 18 is placed in a deposition zone and a process gas comprising a silicon containing gas and a nitrogen containing gas is introduced into the deposition zone through an inlet gas conduit. The wafer 18 is heated to a temperature $T_d$ that is sufficiently high to cause the process gas to deposit silicon nitride on the wafer 18, with the resultant formation of process gas byproducts. The process gas byproducts are exhausted through an exhaust gas conduit.

As further example, any of the four processing station positions 31–34 may receive a conventional semiconductor process reactor for physical vapor deposition (PVD), or sputtering. Such stations may be used to deposit a metallic layer on the surface of the silicon wafer 18. PVD is frequently used to deposit metallic layers of Ti for contacts and metallic layers of Al for interconnects. PVD can also be used to deposit TiN as a barrier layer on silicon wafers. In a PVD process, inert gas particles are first ionized in an electric field to produce a gas plasma. The ionized particles are then directed toward a source or target where the energy of these gas particles physically dislodges, or sputters off, atoms of the metallic source material. Many materials can be deposited using not only RF but also DC power sources. In a typical PVD process chamber, major components include a vacuum-tight stainless steel chamber with a helium leak detector, a pumping capacity that is capable of reducing the chamber pressure to about $10^{-6}$ torr or below, pressure gauges, a sputter source or target, a power supply, and a wafer holder. The sputter source and the wafer holder in the module bottom 35–38 are normally positioned facing each other. The target is, for example, an Al or Ti disc used as the sputter source for the process. Target sizes of thirteen-inches (330 mm) are normally used for processing eight-inch (200 mm) wafers. The target is bonded to a backing plate and has a life expectancy that depends on the power consumption of the process and the target material used.

A typical single-wafer cold-wall CVD chamber is radiantly heated to enable precise temperature control in the range of 500° to 1,000° C. The wafer is mounted on a susceptor, which is a silicon carbide coated graphite disc, to receive uniform deposition of materials on the wafer surface. The susceptor may be rotated by a motor during deposition to further improve the uniformity of the coating. This type of thermal reactor for semiconductor processing provides for high-throughput, flexible thermal control, and process uniformity for large wafers at ambient and reduced pressures. Reactant gases enter the CVD chamber and produce films of various electronic materials on the surface of a wafer for various purposes such as for metalization layers, for dielectric layers, for insulation layers, etc. The various electronic materials deposited include epitaxial silicon, polysilicon, silicon nitride, silicon oxide, and refractory metals such as titanium, tungsten and their silicides. In these film deposition processes, most of the material from the reactive gases is deposited on the wafer surface. However, it is inevitable that a small amount of the material is deposited on heated surfaces inside the chamber other than that of the wafer. This also occurs in a cold-wall CVD system in which the chamber wall is kept cool by the circulation of cooling air outside the chamber to avoid deposition of materials on the wall.

The carousel 30 does not make complete rotations, it is limited, for example, to ±45° rotation back and forth from the position shown in FIG. 1B. Therefore, only a single arm will come into contact with any two adjacent processing stations 31–34. Such back and forth rotation, like an oscillating agitator in a washing machine, helps to reduce the amount of contamination that can exchange between the processing stations while moving a queue of wafers through the system.

FIG. 1C shows the transfer carousel 30 in operation. Wafers 18 are shown transferring clockwise between the four process stations 31–34. The double-axis arm 24 in the anteroom chamber 26 is shown transferring wafers between the cassette 16 and the process station 31.

Figure 2C:
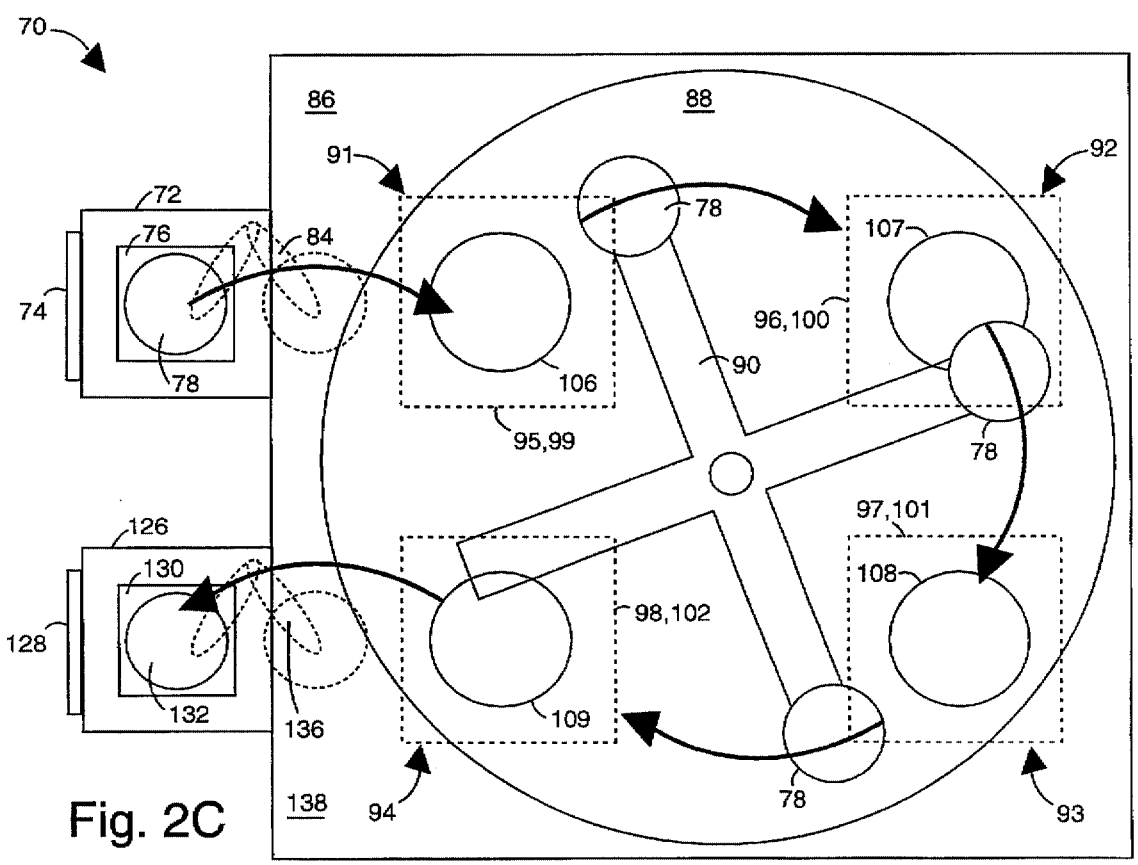
FIG. 2C is a mechanical schematic diagram in plan view of the four-cluster modular wafer processing system of FIG. 2A with the wafer carousel in a second position that allows the cylindrical sleeves at each processing station to be raised to their respective sealed positions.
Figure 2A:
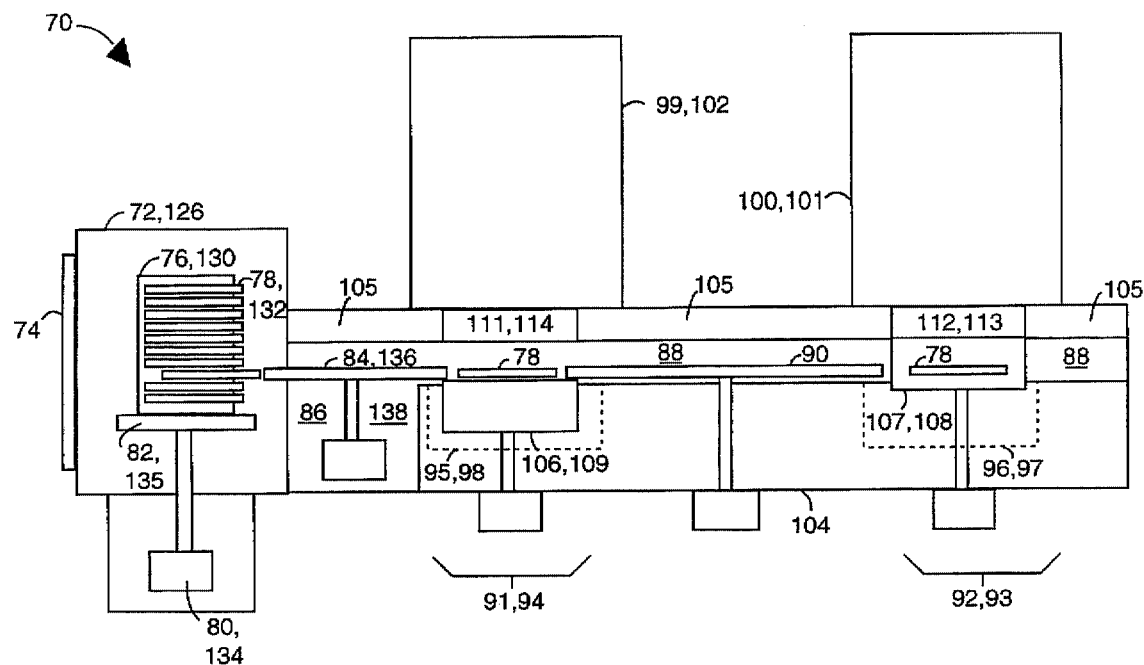
FIG. 2A is a mechanical schematic diagram in side view of a four-cluster modular wafer processing system of the present invention with a first cassette and elevator chamber for unprocessed wafers and a second cassette and elevator chamber for processed wafers.
Figure 2B:
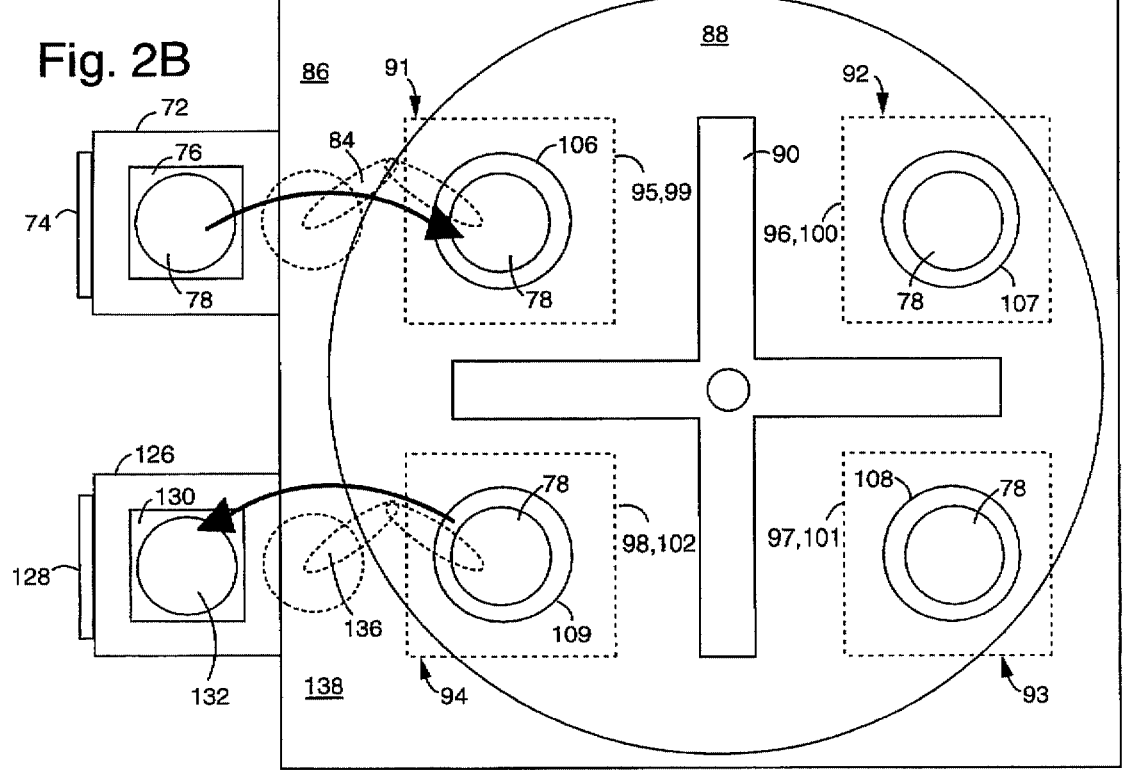
FIG. 2B is a mechanical schematic diagram in plan view of the four-cluster modular wafer processing system of FIG. 2A with the wafer carousel in a first electrode loading position.

FIGS. 2A, 2B, and 2C illustrate a four-cluster modular wafer processing system embodiment of the present invention, referred to herein by the general reference numeral 70. The system 70 is similar to the system 10 and comprises an unprocessed wafer elevator chamber 72 with a vacuum seal door 74 for receiving a cassette 76 of unprocessed semiconductor wafers 78. An elevator drive 80 raises and lowers an elevator platform 82 to select a particular wafer 78 for transfer by a double-axis arm 84 in an anteroom chamber 86. A circular wafer handling chamber 88 includes a multiple-spoke single-axis rigid-arm transfer carousel 90 that oscillates between a set of adjacent processing stations 91–94 to transfer wafers 78 around in a clockwise moving queue. Each of the processing stations 91–94 respectively comprises a bottom 95–98 and a top 99–102. A handling chamber bottom 104 and a lid 105 provide a vacuum seal for the circular wafer handling chamber 88. A set of four cylindrical metal sleeves 106–109 each with top and bottom O-ring seals raise and lower independently or in unison to seal each respective area for process stations 91–94 from the handling chamber bottom 104 to the lid 105.

FIG. 2A shows the cylindrical metal sleeves 106 and 109 in their lowered position and the cylindrical metal sleeves 107 and 108 in their raised and sealed position. The cylindrical metal sleeves 106–109 are lowered to allow the transfer of wafers 78 between the processing stations 91–94. The cylindrical metal sleeves 106–109 are raised and sealed to allow the wafers 78 to be exposed through a corresponding port 111–114 to a particular removable process modules 99–102. For example, the process modules 99–102 may comprise conventional semiconductor process reactors for photo resist removal, cleaning, plasma etching, sputtering, vapor deposition, etc.

The system 70 comprises a processed wafer elevator chamber 126 with a vacuum seal door 128 for outputting a cassette 130 of processed semiconductor wafers 132. An elevator drive 134 raises and lowers an elevator platform 135 to select a spot for a particular processed wafer 132 transferred out by a double-axis arm 136 in an anteroom chamber 138.

FIG. 2C shows the transfer carousel 90 in the act of wafer transfer. Unprocessed wafers 78 are shown transferring clockwise between the four process stations 91–94 and are output as processed wafers 132. The double-axis arm 84 in the anteroom chamber 86 is shown transferring wafers in from the cassette 76 to the process station 91. The double-axis arm 136 in the anteroom chamber 138 is shown transferring processed wafers 132 out to the cassette 130 from the process station 94. Such separation of input and output wafers allows a higher throughput.

Figure 3:
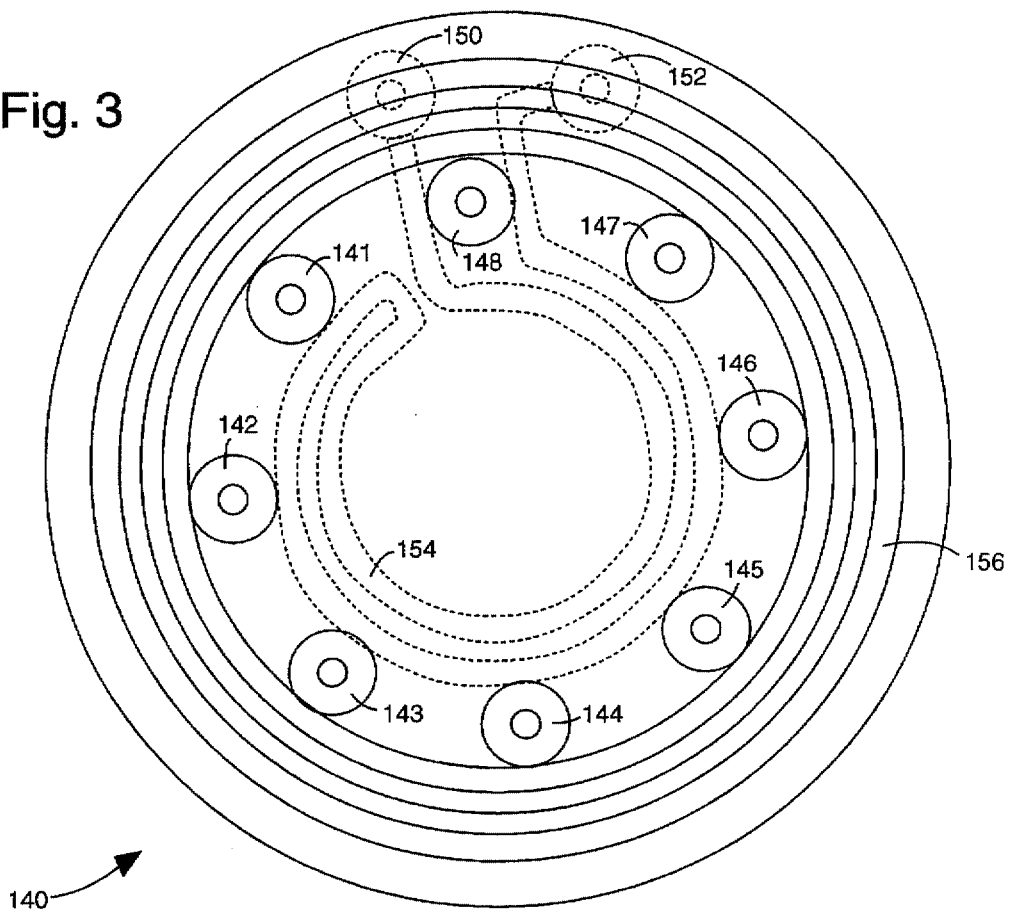
FIG. 3 is a plan view diagram of a wafer preheating well for use in the first processing station of the four-cluster modular wafer processing systems of FIGS. 1A–2C.
Figure 4:
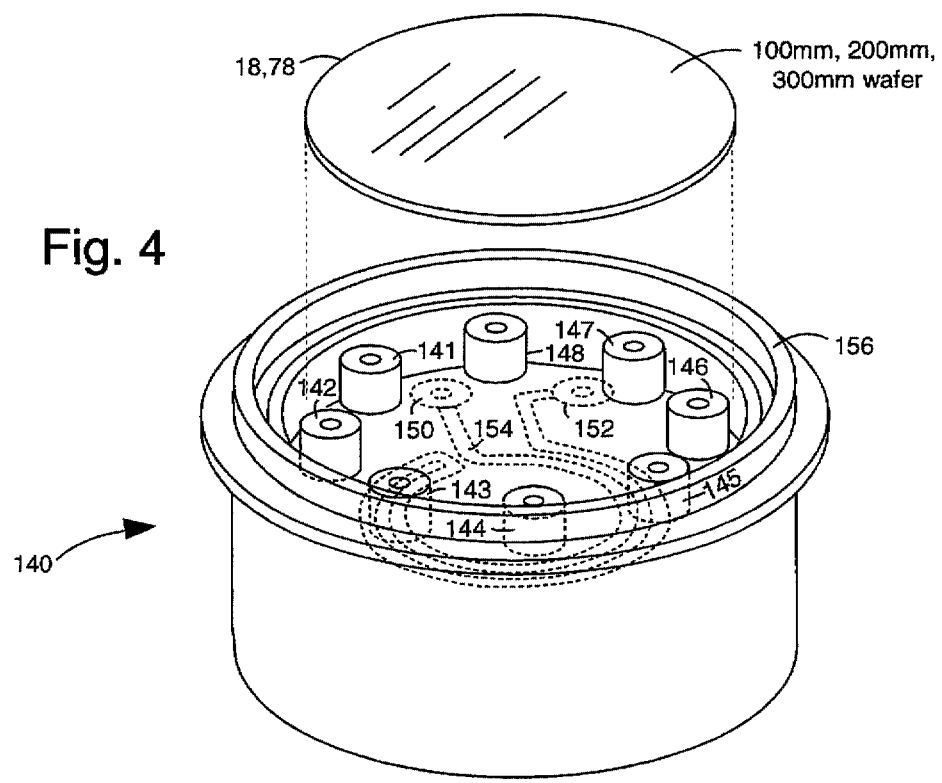
FIG. 4 is a perspective view of the wafer preheating well of FIG. 3.

FIGS. 3 and 4 diagram a wafer preheating well 140 for use in the first processing station of the four-cluster modular wafer processing systems 10 and 70 (FIGS. 1A–1C and 2A–2C). For example, wafers 18 and 78 may be pre-heated at stations 31 and 91 in preparation for further processing at stations 32–34 and 92–94. The well 140 comprises a set of eight optical sensors 141–148 that are used to determine the position of wafers 18 and 78 within the well. A pair of electrodes 150 and 152 connect to a folded-spiral electrical heating element 154. A metal cylindrical sleeve 156 is proportioned to fit snugly within the well and to be moveable between a flush position in the well housing and an extended position, e.g., extended out two or three inches. Preferably, the top and bottom opposite edges of the sleeve are machined and treated to function as gas-tight ring seals in the extended position.

The present invention is not limited to clusters of four processing stations with carousels having four spoked arms. For example, three may be used as sketched in perspective in FIG. 5. As few as two stations may be used. The upper limit of the number of stations possible is in the hundreds, especially if the rigid spoked arm carousel is substituted with a conveyor system.

Figure 5:
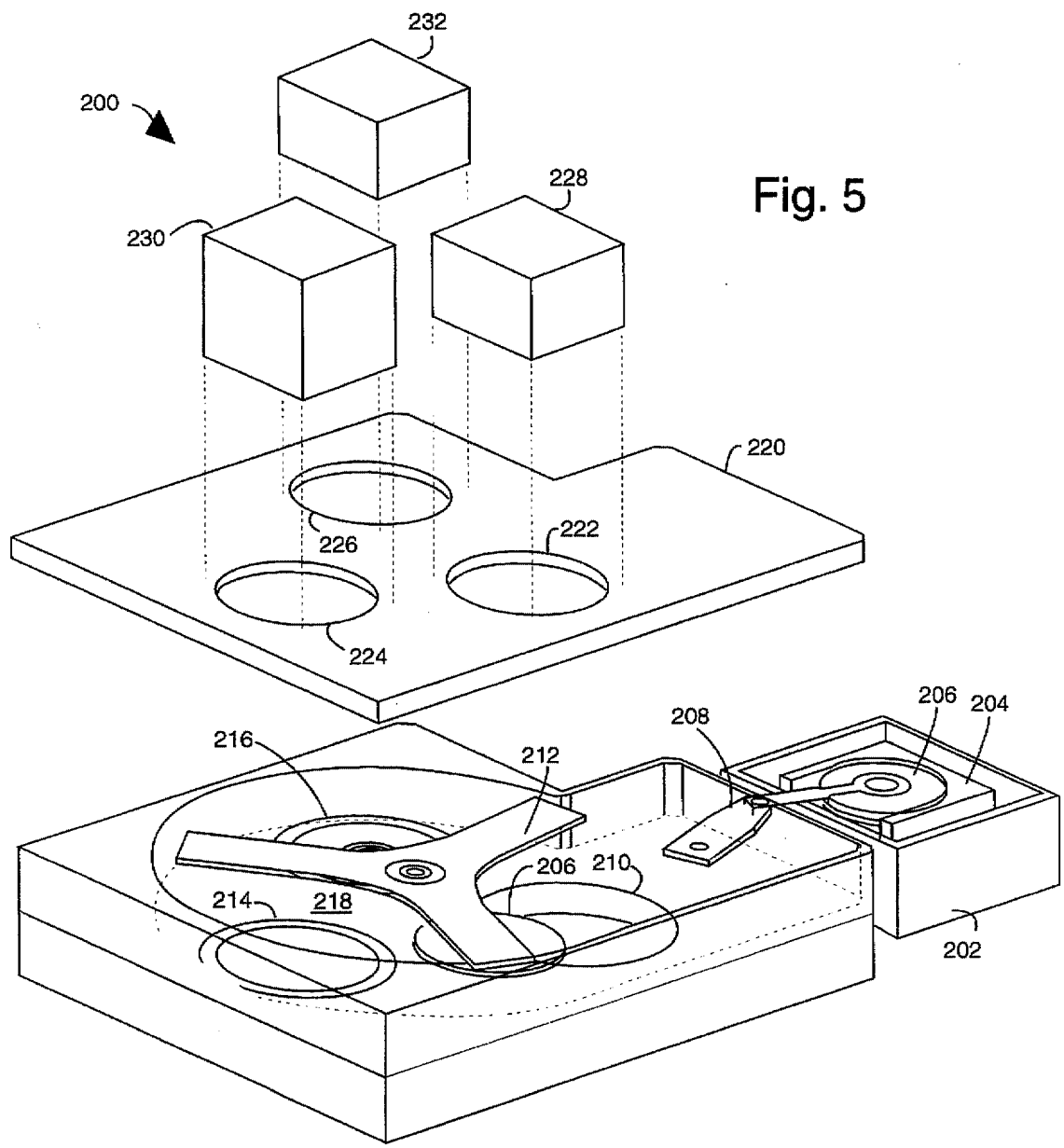
FIG. 5 is a sketch of a three-dimensional exploded assembly of a three-cluster modular wafer processing system embodiment of the present invention.

FIG. 5 shows a wafer processing system 200 that is similar to the four-cluster modular wafer processing systems 10 and 70, except that three processing stations are provided. The system 200 includes an elevator chamber 202 that vacuum locks a cassette 204 of wafers 206. A double-axis wafer transfer arm 208 shuttles unprocessed wafers 206 to a first processing well 210, e.g., for pre-heating. The double-axis wafer transfer arm 208 shuttles processed wafers 206 from the first processing well 210 back to the cassette 204, e.g., after a cool-down. A three-spoke carousel 212 simultaneously can move wafers 206 in a circuit amongst the first processing well 210 and a second processing well 214 and a third processing well 216. The three-spoke carousel 212 rotates in a circular chamber 218 and is enclosed in a gas-tight environment by a lid 220 with a set of three ports 222, 224, and 226. A first process reactor 228 attaches and seals to the lid 220 at the first port 222. A second process reactor 230 attaches and seals to the lid 220 at the second port 224. A third process reactor 232 attaches and seals to the lid 220 at the third port 226. During each process operation, a sleeve, similar to sleeve 156 in FIGS. 3 and 4, rises from wells 210, 214 and 216 to respectively seal against ports 222, 224 and 226.

Figure 6:
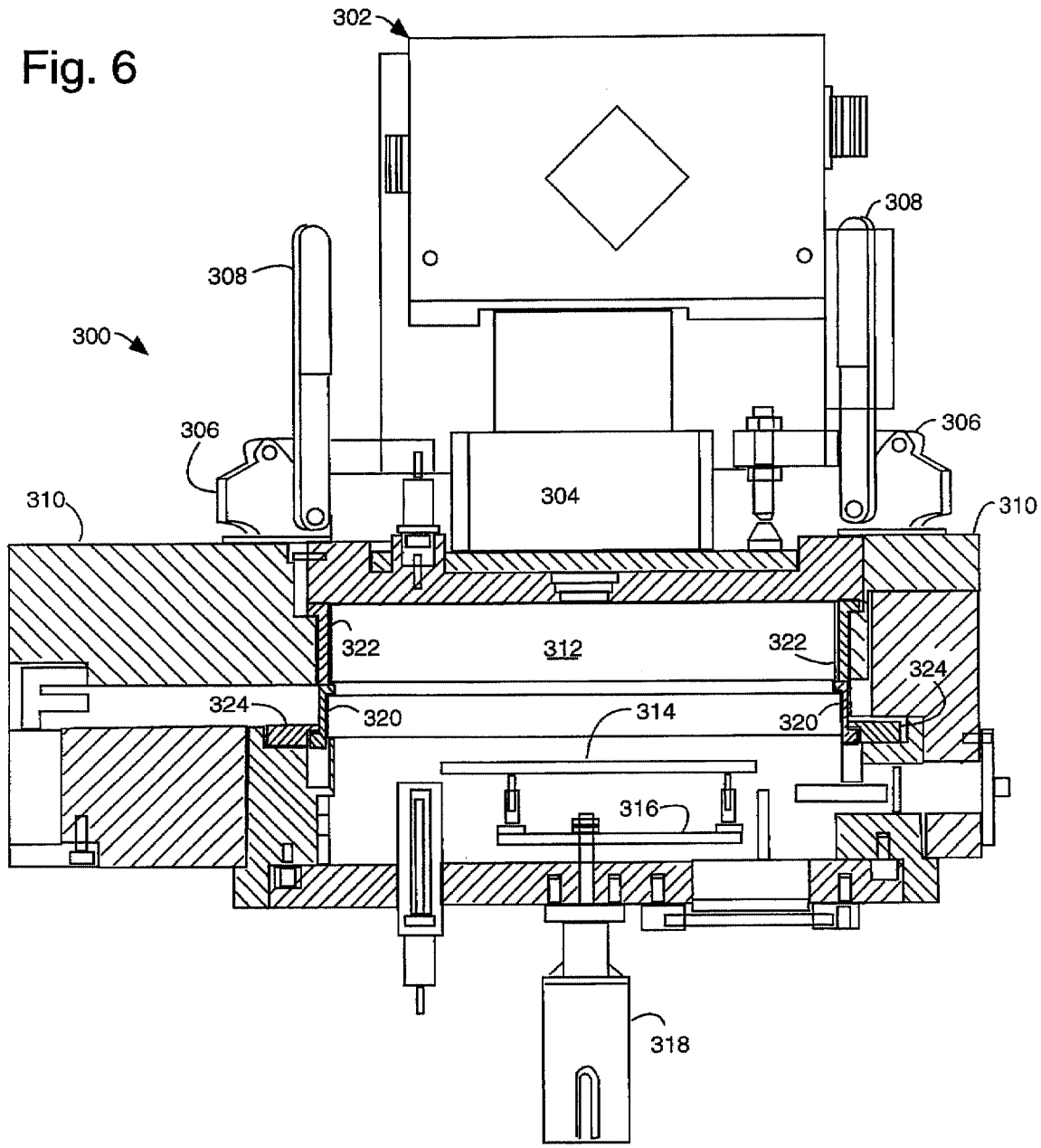
FIG. 6 is a cross-sectional diagram typical of any one of the processing stations in the systems of FIGS. 1A–1C, 2A–2C and 5.

FIG. 6 shows a processing station 300 that is typical of any one of the processing stations included the systems 10, 70 and 200 of FIGS. 1A–1C, 2A–2C and 5. The processing station 300 has a process reactor 302 that sits in a standardized seat 304 and is held in place by quick-clamps 306. A group of quick-clamp handles 308 are manipulated to release and clamp the process reactor 302 to a planar lid 310. The process reactor 302 is similar to process reactors 228–232 of FIG. 5. The lid 310 is similar to the lid 45, 105, and 220 of FIGS. 1A–1C, 2A–2C and 5. The seat 304 is typical of all the other seats on the same lid and all are in the same plane. The object of the seat geometry and clamp arrangement is to permit easy interchangeability of many kinds of process reactors, generators and other conventional semiconductor process devices amongst all the seats on the lid 310.

The process reactor 302 has access through a port 312 in the lid 310 to a wafer 314 held by a fork 316. A manipulator 318 is provided to maneuver the fork 316 and the wafer 314 for transport in and out of the processing station and during operation of the process reactor 302. During such processing, a cylindrical sleeve 320 is raised to contact and seal with an upper ring seat 322 and a lower ring seat 324. In one embodiment, the sleeve 320 has its lower outside edge flared outward to engage the inner lip of the lower ring seat 324. The sleeve 320 further has its inner top edge flared inward to mate flat with the bottom of the upper ring seat 322. Preferably, the sleeve 320 makes a gas-tight seal with both the upper and lower ring seats 322 and 324 and acts as a conduit and chamber for processing the wafer 314.

Although the present invention has been described in terms of the presently preferred embodiment, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A process chamber sleeve for isolating individual process modules in a common cluster, comprising:

a cylindrical body with top and bottom opposite edges and extendible within a process station;

a top ring seal disposed at said top edge for sealing against the inside surface of a lid attached to a wafer handling chamber; and a bottom ring seal disposed at said bottom edge for sealing against the top inside surface of said wafer handling chamber;

wherein said process station is isolated from other process stations located in the same plane of the wafer processing chamber when the cylindrical body is extended to complete the seals of the top and bottom ring seals.

2. The sleeve of claim 1, wherein:

the top ring seal is flared inward of the cylindrical body and mates with an upper seat disposed in said lid.

3. The sleeve of claim 1, wherein:

the bottom ring seal is flared outward of the cylindrical body and mates with lower seat disposed in the floor of said wafer handling chamber.

4. The sleeve of claim 1, wherein:

said wafer handling chamber has a planar lid that provides for the containment of a vacuum and includes a plurality of processing ports distributed around said planar lid with mating seats on an outside surface that provide for interchangeability with a plurality of process reactors that provide for independent types of semiconductor process functions and that each can mount at any one of said mating seats in individual ones of the plurality of processing ports.

5. The sleeve of claim 1, further comprising:

means for allowing the shuttling of wafers for processing to points beneath individual ones of a plurality of processing ports in said lid, wherein said wafers are generally shuttled parallel to the plane of said planar lid simultaneously.

6. A modular wafer processing system, comprising:

a wafer handling chamber with a planar lid that provides for the containment of a vacuum;

a plurality of processing ports distributed around said planar lid with mating seats on an outside surface that provide for interchangeability;

a plurality of process reactors that provide for independent types of semiconductor process functions and that each can mount at any one of said mating seats in individual ones of the plurality of processing ports;

means for shuttling wafers for processing to points beneath individual ones of the plurality of processing ports and accessible to the output of each of the plurality of process reactors in the wafer handling chamber, wherein said wafers are generally shuttled parallel to the plane of said planar lid simultaneously;

a plurality of cylindrical metal sleeves each with top and bottom end ring seals and extendible between the wafer handling chamber and corresponding ones of the plurality of processing ports, and providing for the isolation of each process reactor from another;

an anteroom chamber connected to one side of the wafer handling chamber and including a double-axis wafer transfer arm for linearly transferring a plurality of semiconductor wafers through the anteroom chamber; and an elevator chamber accessible to said double-axis wafer transfer arm and that accepts a cassette loaded with a plurality of said semiconductor wafers through a removable door and including an elevator platform on which said cassettes ride up and down, and an elevator drive to automatically position said elevator platform.

7. The system of claim 6, wherein each of the plurality of cylindrical metal sleeves comprises:

a cylindrical body with top and bottom opposite edges and extendible within a process station;

a top ring seal disposed at said top edge for sealing against the inside surface of a lid attached to a wafer handling chamber; and a bottom ring seal disposed at said bottom edge for sealing against the top inside surface of said wafer handling chamber;

wherein said process station is isolated from other process stations located in the same plane of the wafer processing chamber when the cylindrical body is extended to complete the seals of the top and bottom ring seals.

8. The system of claim 6, wherein:

the means for shuttling wafers comprises a multiple-spoke single-axis rigid-arm transfer carousel centrally located within the wafer handling chamber and providing for a simultaneous clockwise or counterclockwise transfer of a plurality of wafers.

* * * * *